United States Statutory Invention Registration [19]

[11] Reg. Number: H986

Codella et al. [43] Published: Nov. 5, 1991

[54] FIELD EFFECT-TRANSISTOR WITH ASYMMETRICAL STRUCTURE

[75] Inventors: Christopher F. Codella, Marlboro; Nivo Rovedo, Lagrangeville; Seiki Ogura, Hopewell Junction, all of N.Y.

[73] Assignee: International Business Machines Corporation, Armonk, N.Y.

[21] Appl. No.: 363,747

[22] Filed: Jun. 9, 1989

[51] Int. Cl.[5] ..... H01L 2/265

[52] U.S. Cl. ..... 437/41; 437/44

[58] Field of Search ..... 437/44, 913

[56] References Cited

U.S. PATENT DOCUMENTS

| | | | |
|---|---|---|---|
| 4,062,699 | 12/1977 | Armstrong | 148/1.5 |
| 4,280,855 | 7/1981 | Bertin et al. . | |
| 4,318,216 | 3/1982 | Hsu | 437/44 |
| 4,366,613 | 1/1983 | Ogura et al. | 29/571 |
| 4,376,286 | 3/1983 | Lidow | 357/23 |
| 4,442,589 | 4/1984 | Doo et al. | 437/44 |
| 4,502,914 | 3/1985 | Trumpp et al. . | |
| 4,514,897 | 5/1985 | Chiu et al. | 437/44 |
| 4,532,697 | 8/1985 | Ko | 29/571 |
| 4,597,824 | 7/1986 | Shinada et al. | 156/643 |
| 4,599,118 | 7/1986 | Han et al. | 148/1.5 |
| 4,616,399 | 10/1986 | Ooka | 29/571 |
| 4,616,401 | 10/1986 | Takeuchi | 29/571 |
| 4,636,822 | 1/1987 | Codella et al. | 357/22 |
| 4,637,124 | 1/1987 | Okuyama et al. | 29/571 |
| 4,682,404 | 7/1987 | Miller et al. | 29/571 |
| 4,729,001 | 3/1988 | Haskell | 357/23.3 |
| 4,737,828 | 4/1988 | Brown | 357/23.1 |
| 4,746,624 | 5/1988 | Cham et al. | 437/44 |

FOREIGN PATENT DOCUMENTS

| | | |
|---|---|---|
| 0033003 | 12/1980 | European Pat. Off. . |
| 0111086 | 10/1983 | European Pat. Off. . |
| 0248292 | 5/1987 | European Pat. Off. . |
| 115863 | 7/1983 | Japan . |
| 194367 | 11/1983 | Japan . |

OTHER PUBLICATIONS

IEDM 82, pp. 718–721, by S. Ogura et al., "A Half Micron MOSFET Using Double Implanted LDD".

European Search Report EP 90 48 0063.

IBM Technical Disclosure Bulletin, vol. 30, No. 3, Aug. 1987, pp. 1136–1137, "Process for Making Very Small, Asymmetric, Field-Effect Transistors".

*Primary Examiner*—John S. Maples

*Assistant Examiner*—Shean C. Wu

*Attorney, Agent, or Firm*—Jeffrey L. Brandt

[57] ABSTRACT

A field effect transistor of asymmetrical structure comprises: a semiconductor substrate of first conductivity type; source and drain regions of second conductivity type disposed in a surface of the substrate and spaced apart by a channel region; and a single, lightly doped extension of the drain region into the channel, the extension being of the second conductivity type and of a lower dopant concentration than the drain region. The transistor can further beneficially comprise a halo region of the first conductivity type in the substrate generally surrounding only the source region.

12 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FIELD EFFECT-TRANSISTOR WITH ASYMMETRICAL STRUCTURE

The present invention relates generally to semiconductor devices and more particularly to a field effect transistor (FET) having asymmetrical sourcedrain regions and a method of manufacturing the same.

BACKGROUND OF THE INVENTION

Current efforts towards decreasing the size of transistor devices have resulted in attempts to fabricate FETs having increasingly shorter channel lengths. As FET channels approach the micron and submicron range, however, the resulting devices exhibit undesirable operating characteristics. These undesirable characteristics include, but are not limited to: 1) decreased breakdown voltage, 2) decreased punch-through voltage, 3) degraded threshold voltage control, and 4) hot-electron induced degradation.

Responsive to the above-described problems, various changes have been made to the FET structures particularly to the source and drain region structures proximate the device channel. U.S. Pat. No. 4,366,613 to Ogura et al., assigned to the assignee of the present invention, shows the use of a lightly doped drain (LDD) structure for increasing the breakdown voltage and inhibiting hot-electron induced degradation in short channel devices. This LDD structure consists of lightly doped extensions of the source and drain regions, of same conductivity type as the source and drain regions, into the channel region.

"A Half-Micron MOSFET Using Double Implanted LDD", by S. Ogura et al., 1982 IEDM Technical Digest, page 718, shows an FET including pockets (or "halos") surrounding the LDD drain and source extensions in the vicinity of the device channel, these pockets being of opposite conductivity type to the LDD extensions. Similar halos are shown in U.S. Pat. No. 4,636,822 to Codella et al., assigned to the assignee of the present invention, and in U.S. Pat. No. 4,597,824 to Shinada et al. In operation, these halos function to reduce undesirable short channel effects, including decreased threshold voltage and decreased punchthrough voltage.

Japanese Kokai No. 58-194,367 shows an FET including both LDD source and drain extensions, and a single pocket surrounding the source LDD extension. A process is shown for forming the device, the process requiring at least one highly accurate photolithographic masking step.

Japanese Kokak No. 58-115,863 shows an FET including a buried, high-dopant concentration region underlying the source and drain region, and at least one pocket surrounding the drain region, or pockets surrounding both the source and drain region.

As discussed above, the shortening of the FET channels, and the providing of subsequently smaller, more densely packed devices comprises a priority in the field. This is evidenced by the above-described publications directed to just such ends. Such accomplishments, particularly when achieved without the concomitantly expected degradations in operating performance, provide a significant contribution to the art.

An object of the present invention is to provide a new and improved FET and a method of fabricating the same.

Another object of the present invention is to provide such a FET having a sub-micron gate length and improved operating characteristics relative to the prior art.

A further object of the present invention is to provide a method for fabricating the above-described FET having a sub-micron gate length and an asymmetrical structure in the FET channel region.

In accordance with one aspect of the present invention there is provided a field effect transistor of asymmetrical structure comprising: a semiconductor substrate of first conductivity type; source and drain regions of second conductivity type disposed in a surface of the substrate and spaced apart by a channel region; and a single, lightly doped extension of the drain region into the channel, the extension being of the second conductivity type and of a lower dopant concentration than the drain region.

In accordance with another aspect of the invention there is provided a field effect transistor of asymmetrical structure comprising: a semiconductor substrate of first conductivity type; source and drain regions of second conductivity type disposed in a surface of the substrate and spaced apart by a channel region; a single halo region generally surrounding the source region in the substrate, the halo region of the first conductivity type and of a higher dopant concentration than the substrate; and a single lightly doped extension of the drain region into the channel, the extension being of the second conductivity type and of a lower dopant concentration than the drain region.

In accordance with another aspect of the invention there is provided a method of forming a field effect transistor, comprising the steps of: providing a semiconductor substrate of first conductivity type; forming source and drain regions of second conductivity type in a surface of the substrate and spaced apart by a channel region; and forming a single, lightly doped extension of the drain region into the channel, the extension being of the second conductivity type and of a lower dopant concentration than the drain region.

In accordance with yet another aspect of the present invention, there is provided a method of forming a field effect transistor, comprising the steps of: providing a semiconductor substrate of first conductivity type; forming a generally conformal layer of gate electrode material over the device region; forming a mask over the layer of gate electrode material, the mask including a generally vertical edge situated over the substrate; forming a first device region in a portion of the substrate self-aligned with the mask; using the mask to define a gate electrode from the layer of gate electrode material while exposing a previously masked portion of the substrate adjoining the gate electrode; and forming a second device region in the newly exposed portion of the substrate self-aligned with the gate electrode.

BRIEF DESCRIPTION OF THE DRAWINGS

These and other objects, features, and advantages of the present invention will become apparent from a consideration of the following detailed description of the invention when read in conjunction with the drawing Figures, in which.

DETAILED DESCRIPTION OF THE INVENTION

Figure 1:
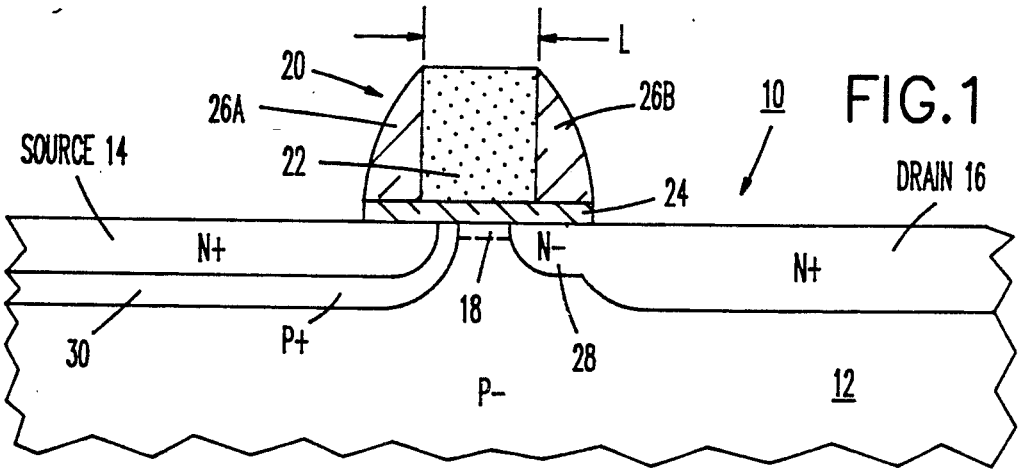
FIG. 1 is a cross-sectional view of an insulated gate (IG) FET constructed in accordance with the present invention.

Referring now to the drawings, FIG. 1 shows an IGFET 10 fabricated on a a substrate 12 of P− silicon semiconductor material. As used herein, "P" and "N" refer to semiconductor doping types, while "+" and "−" are used as appropriate to describe relative doping concentrations.

IGFET 10 includes heavily doped N+ source and drain regions, 14 and 16, respectively, disposed in the surface of substrate 12 and spaced by a channel portion 18 of the substrate. A gate structure 20 is situated on the surface of substrate 12, generally spanning source and drain regions 14, 16, and overlying channel region 18. Gate structure 20 includes an electrode 22 of conductive material, preferably doped polysilicon or a metal such as an aluminum-copper alloy, the electrode being spaced from the surface of substrate 12 by a thin layer 24 of silicon dioxide ($SiO_2$). Gate electrode 22 is of a length L, as described in further detail below, that may beneficially be shorter than 1 micron Channel region 18 can include a threshold adjustment implant (not shown) in a manner well understood in the art.

In the embodiment shown, gate structure 20 further includes sidewalls 26A, 26B of an insulating material, preferably silicon nitride ($Si_3N_4$). Sidewalls 24A, 24B are used both in the formation of the device source and drain regions in the manner described below, and as insulators in the subsequent metallization (not shown) of IGFET 10.

In accordance with one aspect of the present invention, IGFET 10 includes further structural features making the device asymmetrical proximate channel region 18 underneath gate structure 20. More specifically, an N−, lightly doped extension (or tip) region 28 extends from the edge of N+ drain region 16, underneath sidewall 26B and just past the right-most edge of gate electrode 22. Extension 28 is of a lower dopant concentration and lesser depth into substrate 12 than is drain region. It is an important feature of the present invention that extension 28 is formed only on drain region 16, and not symmetrically on source region 14 as is commonly taught in the art.

A further important feature of the present invention is the inclusion of a single P+ halo, or pocket region 30 extending from channel 18 beneath gate electrode 22 and surrounding source region 14. Again, it is important to note that IGFET 10 includes only the single halo 30 surrounding the source region 14, and no symmetrical halo surrounding drain region 16 as is taught conventionally in the art.

In operation, extension region 28 of drain 16 functions to increase the device breakdown voltage and reduce the hot carrier effects, while the exclusion of the symmetrical extension from the source region avoids a high series resistance and accompanying drawbacks associated therewith. Additionally, it has been discovered that the inclusion of halo region 30 about source region 14 functions to reduce short channel threshold voltage fall-off, and also to inhibit device punch-through. Because no halo is formed surrounding drain region 16, the present invention avoids disadvantages of decreased breakdown voltage and increased device capacitance associated therewith.

Analysis of IGFET 10 as described above shows that the device can be operated with a channel length L in the range of 0.10–0.20, microns while exhibiting greatly improved operating characteristics relative to prior art devices attempting to achieve this same dimension.

It will be noted at this point that, while IGFET 10 has been described as including two asymmetrical features, i.e. halo 30 about source 14 and extension 28 with drain 16, either of these features may be utilized singly to improve the operating characteristics of the devices. Further, while the invention has so far been described with respect to an N-channel, enhancement mode device, through the appropriate adjustment of conductivity types and concentrations, it is equally applicable to P-channel enhancement mode devices, and to both N- and P-channel depletion mode devices.

Referring now to the series of FIGS. 2A-2E, a method of forming an asymmetrical FET device of the type shown in FIG. 1 is illustrated and described. It is noted at this point that the formation of IGFET 10 with a sub-micron channel length L requires extremely accurate alignment of the various device regions and structures. This accuracy is not typically available using conventional photolithographic techniques.

Figure 2A:
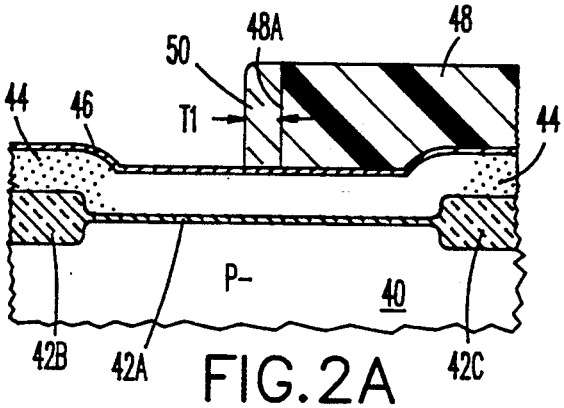
FIGS. 2A–2F are cross-sectional views showing successive steps in a method of constructing the IGFET of FIG. 1.

Referring now to FIG. 2A, a portion 40 of a P−, silicon semiconductor substrate is provided for supporting the formation of an FET device. A layer 42 of oxide ($SiO_2$) is formed over the upper surface of substrate 40, layer 42 including a relatively thin gate oxide region 42A bounded by relatively thicker, electrically isolating field oxide regions 42B, 42C. Oxide layer 42 is formed by known, conventional techniques. Gate oxide region 42A has a thickness, for example, in the range of about 100–200 Angstroms.

A layer 44 of polysilicon is formed over oxide layer 42, for example to a thickness of about 3,000 Angstroms. Polysilicon layer 44 can be formed by a conventional chemical vapor deposition (CVD) process, and is either formed in situ doped, or subsequently doped by ion implantation (I/I) to a concentration in the range of about $1\times10^{20}$ atoms/cm$^3$. A thin layer 46 of $SiO_2$, for example in the range of 400 Angstroms, is formed on the upper surface of polysilicon layer 44. Oxide layer 46 can be formed, for example, by a conventional process of thermal oxidation or chemical vapor deposition.

Continuing to describe FIG. 2A, a mask 48 of photoresist material is formed so as to include a substantially vertical edge 48A generally centered over the surface of gate oxide region 42A. Mask 48 is formed using conventional photolithographic techniques of blanket deposition of a photoresist material (a single or multilayer photoresist structure can be used), and exposure and development of the resist to form the mask. It should be noted that the positioning of edge 48A, a step not critical to the subsequent formation of a FET device, is the only step in the device formation which is not self-aligned to other device features.

Subsequent to the formation of mask 48, a vertical sidewall 50 of insulating material, preferably plasma deposited $Si_3N_4$, is formed over edge 48A. Sidewall 50 is formed, for example by a conventional process including the steps of: 1) forming a layer of $Si_3N_4$ generally conformally over the surface of the device, and 2) etching the $Si_3N_4$ layer with an anisotropic etch process to leave sidewall 50. An appropriate etch process would include a reactive ion etch (RIE) with a plasma selective to $Si_3N_4$, for example $CHF_3$ or $CF_4/H_2$. The thickness, T1, of sidewall 50 can be very accurately controlled by controlling the thickness of the conformal layer of $Si_3N_4$.

Figure 2B:
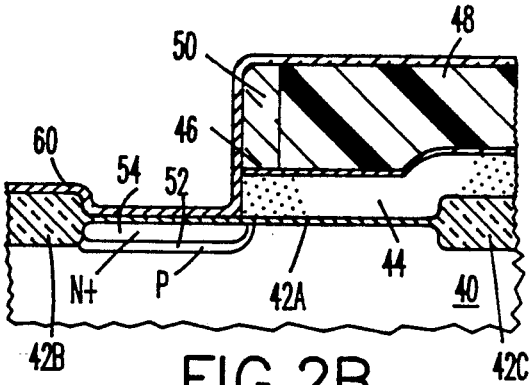

To obtain the structure shown in FIG. 2B, the exposed portions of oxide layer 46 and the subsequently exposed portions of underlying polysilicon layer 44 are sequentially removed. It is desired to leave vertical edges subsequent to the removal of these layer portions, and hence the use of an anisotropic RIE process is preferred. Exposed portions of oxide layer 46 are removed, for example, using a RIE process with a $CF_4$ plasma. Subsequently exposed portions of polysilicon layer 44 are then removed, for example, using a RIE process with a $Cl_2$ plasma. This $Cl_2$ plasma is effectively stopped by oxide layer 42.

P+ ions (not shown) are implanted into the portion of substrate 40 framed between field oxide region 42B and sidewall 50, using the field oxide, sidewall, and mask 48 as the I/I mask. This I/I is performed, for example, using boron ions, and with a power and dopant concentration sufficient to form a P+ halo region 52 to a depth greater than a subsequently formed source region. A second I/I is then performed with N+ ions, for example of phosphorus or arsenic, to form an N+ source region 54 within halo region 52. This second I/I uses the same mask as that used to form halo region 52. It will be understood that the relative order of forming these halo and source regions can be reversed.

A protective layer 60 of $SiO_2$ is deposited conformally over the device, to a thickness of about 800 Angstroms.

Figure 2C:
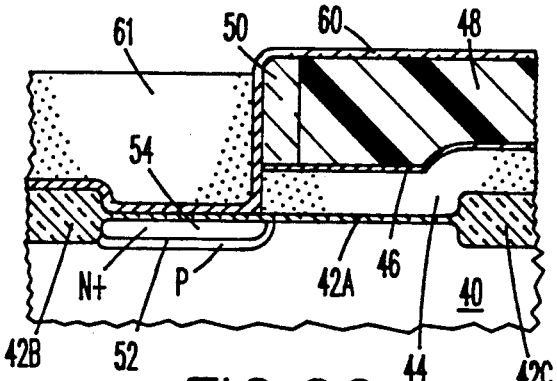

To form the structure of FIG. 2C, a planarized layer 61 of resist material is formed over those portions of the device not covered by mask 48. Resist layer 61 is formed by the conventional process of spinning on a layer (not shown) of resist to a thickness greater than that of mask 48. As is known in the art, this spinning process results a resist layer having a relatively planar upper surface. This relatively planar layer of resist is then thinned, for example using a RIE process with an oxygen plasma, to a thickness slightly less than that of mask 48. This thinning process results in the higher regions of oxide layer 60 (i.e. those regions covering the upper surface of mask 48 and sidewall 50) being exposed.

Figure 2D:
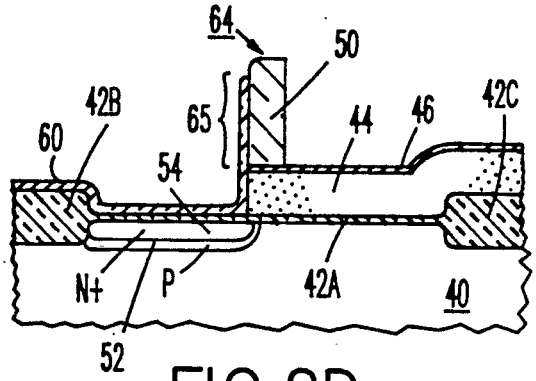

To obtain the structure shown in FIG. 2D, appropriate etchants are used to remove first the exposed regions of oxide layer 60, and next the resist materials including layer 61 and mask 48. For example, an HF solution can be used to remove the exposed portions of oxide layer 60, while an oxygen plasma can be used to remove the resist materials. The resulting device includes a narrow, vertical structure 64, defined by sidewall 50 and the adjoining vertical portion 65 of oxide layer 60.

Figure 2E:
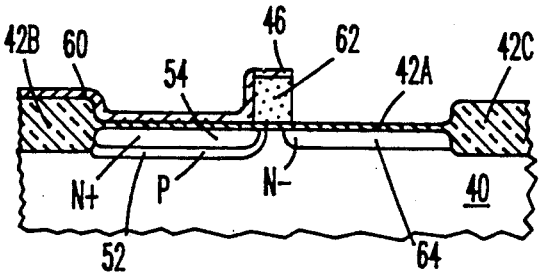

To form the structure shown in FIG. 2E, nitride sidewall 50 is used as a mask for a directional etch of first the exposed region of oxide layer 46, then the exposed region of polysilicon layer 44. Oxide layer 46 can be etched, for example, using a RIE process with a $CF_4$ plasma, which will also reduce the thickness of oxide layer 60. Polysilicon layer 44 can be etched, for example, with a RIE process using a $Cl_2$ plasma. Sidewall 50 is then removed using an appropriate etch, such as $H_3PO_4$. The remaining, free-standing vertical portion 65 of oxide layer 60 is removed using a mild 50:1 solution of HF. Because vertical extension 65 of oxide layer 60 is free-standing, the HF solution will etch the extension bi-directionally, removing the extension while leaving a thickness of the remaining portion of layer 60. The result of these etching steps is the definition of a polysilicon gate electrode 62.

An I/I is performed in the surface of substrate 12, so as to form a relatively shallow, relatively lightly doped N− region 64 extending between gate electrode 62 and field oxide region 42C. This I/I is performed using field oxide regions 42B, 42C, and gate electrode 62 as an I/I mask. It will be appreciated that this relatively light, shallow I/I has no appreciable affect on the heavily doped source region 54 or the heavily doped, deeper halo region 52.

Figure 2F:
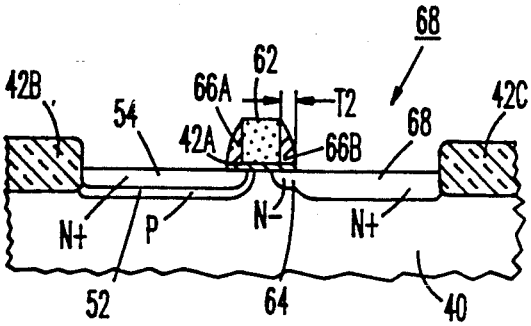

Referring now to FIG. 2F, sidewalls 66A, 66B of insulating material, preferably $SiO_2$, are formed on the vertical edges of gate electrode 62. Sidewalls 66A, 66B are formed by a conventional process of blanket depositing a thick layer of oxide (not shown) conformally over the device, then anisotropically etching the thick layer with an appropriate RIE process, for example using a $CHF_3$ plasma. The thickness T2 of sidewalls 66A, 66B can be very accurately controlled by controlling the thickness of the conformal layer of oxide.

Subsequent to the formation of sidewalls 66A, B, an I/I of N+ ions is performed, for example using arsenic, so as to form a drain region 68 in substrate between sidewall 66B and field oxide 42C. The power and dopant concentration of the I/I are selected so as to make drain region 68 relatively deeper and more highly doped than lightly doped extension 64. Sidewalls 66A, 66B, and field oxide regions 42B, 42C, function as masks for this I/I. It will be appreciated that the device area over source region 54 is left unmasked, this last I/I functioning beneficially to increase the concentration of the source region. The remaining exposed portions of oxide layers 46, 60 are subsequently stripped by an appropriate etchant, for example a 40:1 HF solution, to leave the structure shown in FIG. 2F.

The resultantly formed enhancement-mode, N channel IGFET 68 is identical to device 10 of FIG. 1 above.

Through a consideration of the above-described process steps, it will be appreciated that, by using sidewall 50 as a mask in forming halo region 52 and source region 54 (FIG. 2A), these two regions are self-aligned with each other and with subsequently defined gate electrode 62. In a similar manner, by using gate electrode 62 as a mask in forming lightly-doped extension region 64 (FIG. 2E), the extension region is self-aligned to the gate electrode. The use of sidewall 66B as a mask to form drain region 68 (FIG. 2F) makes the drain region self-aligned relative to both gate electrode 62 and extension region 64.

These self-aligned process steps comprise major features of the present invention, and provide the significant advantage of permitting the FET to be reliably and repeatedly formed with a channel length L of submicron dimension as described above. They further permit these accurate dimensions to be achieved while simultaneously providing an asymmetrical device having the improved operating characteristics as described with respect to FIG. 1 above.

Referring now to the series of FIGS. 3A–3D, a modified embodiment of the process of FIGS. 2A–2F is shown wherein it is desired to form the asymmetrical halo region 52 around source region 54. Like features are indicated by like reference numbers.

Figure 3A:
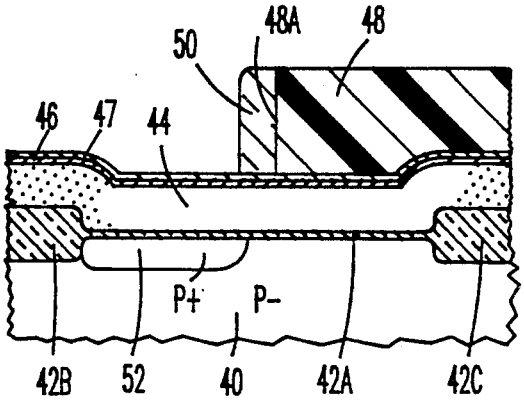
FIGS. 3A-3F are cross-sectional views showing successive steps in a second method of constructing an IGFET in accordance with the present invention.

Referring now to FIG. 3A, a device structure substantially identical to that of FIG. 2A above is shown, one difference being that P+ halo region 52 has been implanted prior to the etching of layers 44 or 46 so as to be self-aligned to sidewall 50. The only other difference is the inclusion of an optional, CVD deposited layer 47 of polysilicon over oxide layer 46.

Figure 3B:
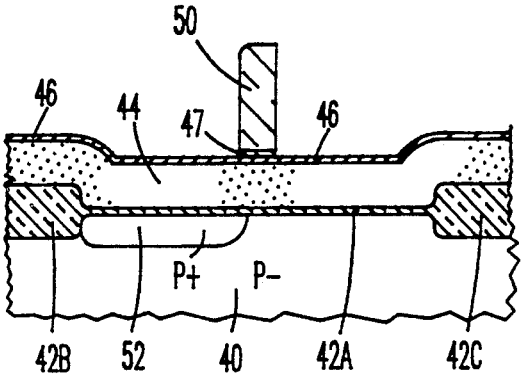
Figure 3C:
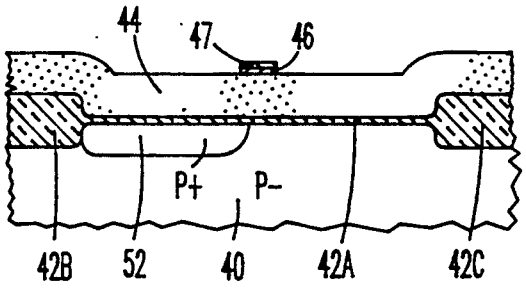

FIG. 3B shows resist mask 48 removed, while FIG. 3C is obtained by using sidewall 50 as a mask to etch the exposed portions of layers 47, 46, sequentially, and then removing the sidewall itself. These features are etched using appropriate processes as described above. It will be appreciated that polysilicon layer 47, which can also be used in the process of FIGS. 2A–2F described above, functions as an etch stop during the removal of resist mask 48.

Figure 3D:
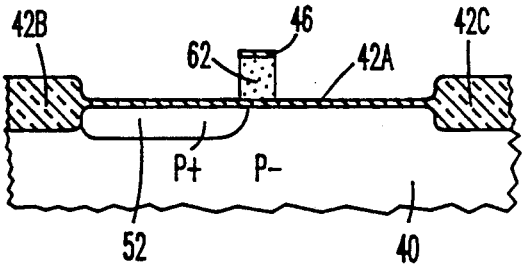

To obtain the structure shown in FIG. 3D, the remaining, registered portions of layers 46, 47 are used as a mask in an anisotropic RIE process to remove the exposed portions of polysilicon layer 44. It will be understood that polysilicon layer portion 47 is also removed in this last etching step. This etching step is performed using the appropriate etch process described above, and results in the definition of gate electrode 62. A portion of oxide layer 46 remains on the upper surface of the gate electrode.

To obtain the structure of FIG. 3D, field oxide regions 42B, 42C, and gate electrode 62 with oxide cover 46, are used as a mask for an I/I. This I/I is performed with N+ ions to form highly doped N+ source and drain regions 54, 68, respectively. This I/I is performed such that source region 54 is relatively shallower than halo region 52. It will be appreciated that halo region 52 is self aligned to source region 54, and that the halo, source, and drain regions are all self-aligned to gate electrode 62.

Figure 3E:
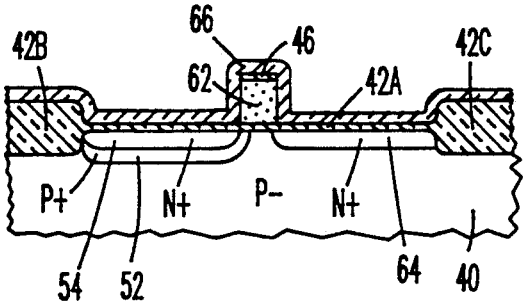
Figure 3F:
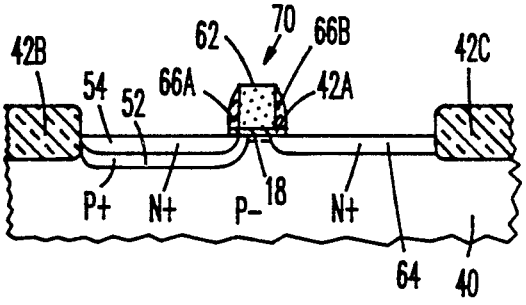

To complete the desired FET structure, a layer 66 (shown in FIG. 3E) is formed conformally over the device, and subsequently etched to leave the FET structure 70 shown in FIG. 3F. FET 70 of FIG. 3E is substantially identical to FET 68 of FIG. 2F, with the exclusion of the LDD extension 64 included in the latter.

From a consideration of the above-described process steps, it will be appreciated that the processes of FIGS. series 2 and 3 each describe a method of fabricating an FET device wherein source and drain regions are self-aligned to a gate structure. The processes are capable of reliably and repeatedly forming FETs having sub-micron gate lengths, and can advantageously be used to form devices of asymmetrical structure.

There is thus provided a new and improved FET having a sub-micron channel length and exhibiting significantly improved operating characteristics relative to prior art devices. This operation is obtained through the use of an asymmetrical source and/or drain structure in the region of the device channel. Further provided is a new and improved method for forming a FET having the device source and drain regions self-aligned to the device gate. This process is particularly adaptable for use in the manufacture of an asymmetrical FET.

The present invention has application in the manufacture of semiconductor devices, and particular application in the manufacture of very large scale integration (VLSI) logic and memory circuits including IGFET devices.

While the present invention has been shown and described with respect to preferred embodiments, it will be appreciated that it is not so limited. Numerous modifications, changes and improvements will occur to those skilled in the art without departing from the spirit and scope of the invention.

What is claimed is:

1. A method of forming a field effect transistor, comprising the steps of:

providing a semiconductor substrate of first conductivity type;

forming a generally conformal layer of gate electrode material over said substrate;

forming a mask over said layer of gate electrode material, said mask including a generally vertical edge situated over said substrate;

forming a halo region of said first conductivity type in said substrate self-aligned with said vertical edge of said mask;

forming a source region of said second conductivity type in said halo region;

using said mask to define a gate electrode from said layer of gate electrode material while exposing a previously masked portion of said substrate adjoining said gate electrode;

forming a lightly doped region of said second conductivity type in said substrate self-aligned with an edge of said gate electrode on a side of said gate electrode opposite said source region;

forming a sidewall of protective material on the side of said gate electrode overlying said lightly doped region; and forming a drain region of said second conductivity type in said substrate using said gate electrode and said sidewall as a mask such that said lightly doped region extends said drain region under said sidewall;

said step of forming said source region performed before said steps of forming said lightly doped region and said sidewall so that said lightly doped region extends only said drain region under said sidewall.

2. A method in accordance with claim 1 wherein said steps of forming said first and second regions include implanting ions into said surface of said substrate.

3. A method in accordance with claim 1 wherein:

said steps of forming a mask includes forming a sidewall on said mask edge; and said step of using said mask to define a gate electrode includes the step of using said sidewall to define said gate electrode.

4. A method in accordance with claim 1 and further including the step of forming a layer of insulating material intermediate said substrate and said layer of gate electrode material.

5. A field effect transistor of asymmetrical structure comprising:

a semiconductor substrate of first conductivity type;

source and drain regions of second conductivity type disclosed in a surface of said substrate and spaced apart by a channel region; and a single, lightly doped extension of said drain region into said channel, said extension being of said second conductivity type and of a lower dopant concentration than said drain region.

6. The field effect transistor of claim 5 wherein said extension is proximate said surface of said substrate.

7. The field effect transistor of claim 6 and further including a gate electrode overlying said channel region and insulated from the surface of said channel region.

8. A field effect transistor of asymmetrical structure comprising:

a semiconductor substrate of first conductivity type;

source and drain regions of second conductivity type disposed in a surface of said substrate and spaced apart by a channel region;

a single halo region generally surrounding said source region in said substrate, said halo region of said first conductivity type and of a higher doping concentration than said substrate; and a single lightly doped extension of said drain region into said channel, said extension being of said second conductivity type and of a lower dopant concentration than said drain region.

9. A field effect transistor in accordance with claim 8 wherein said extension is proximate said surface of said substrate.

10. A field effect transistor in accordance with claim 9 wherein said extension is of a shallower depth into said substrate than said drain region.

11. A field effect transistor in accordance with claim 8 and further including a gate electrode situated over said channel region and insulated from said channel region.

12. A field effect transistor in accordance with claim 11 wherein said gate electrode generally spans said channel to overlap said drain extension, said halo region, and said source region.

* * * * *